United States Patent [19]

Moore et al.

[11] Patent Number: 5,178,681
[45] Date of Patent: Jan. 12, 1993

[54] SUSPENSION SYSTEM FOR SEMICONDUCTOR REACTORS

[75] Inventors: Joseph C. Moore; Paul L. Deaton, both of Milpitas, Calif.

[73] Assignee: Applied Materials, Inc., Santa Clara, Calif.

[21] Appl. No.: 647,386

[22] Filed: Jan. 29, 1991

[51] Int. Cl.⁵ ............................................. H01L 21/00
[52] U.S. Cl. ................................. 118/715; 118/731; 118/733; 118/725; 156/345; 403/287
[58] Field of Search ............... 118/729, 730, 731, 733, 118/715, 725; 156/345; 403/310, 311, 300, 349, 287; 285/413, 414

[56] References Cited

U.S. PATENT DOCUMENTS

| | | | |
|---|---|---|---|
| 4,226,208 | 10/1980 | Nishida et al. | 118/730 |
| 4,496,828 | 1/1985 | Kusmierz et al. | 118/730 |
| 4,632,060 | 12/1986 | Goto et al. | 118/733 |
| 4,668,119 | 5/1987 | Galletti | 403/349 |
| 4,756,638 | 7/1988 | Neyret | 403/349 |

FOREIGN PATENT DOCUMENTS

| | | |
|---|---|---|
| 0270991 | 12/1987 | European Pat. Off. . |
| 2422527 | 11/1975 | Fed. Rep. of Germany . |
| 62-219913 | 9/1987 | Japan . |
| 63-012128 | 1/1988 | Japan . |

Primary Examiner—Brian E. Hearn
Assistant Examiner—George Goudreau
Attorney, Agent, or Firm—Paul L. Hickman

[57] ABSTRACT

A suspension system for hanging a susceptor inside a reactor for processing semiconductor wafers. A hanger is provided with a flange at its lower end for supporting the susceptor. A collar has an internal flange which engages with another flange at the upper end of the hanger. The collar flange and the hanger flange each have a trucated, conical contact surface which are in substanitally continuous contact with each other. The mating flanges permit the susceptor to self-center and provide for different rates of thermal expansion of the collar and hanger.

15 Claims, 4 Drawing Sheets

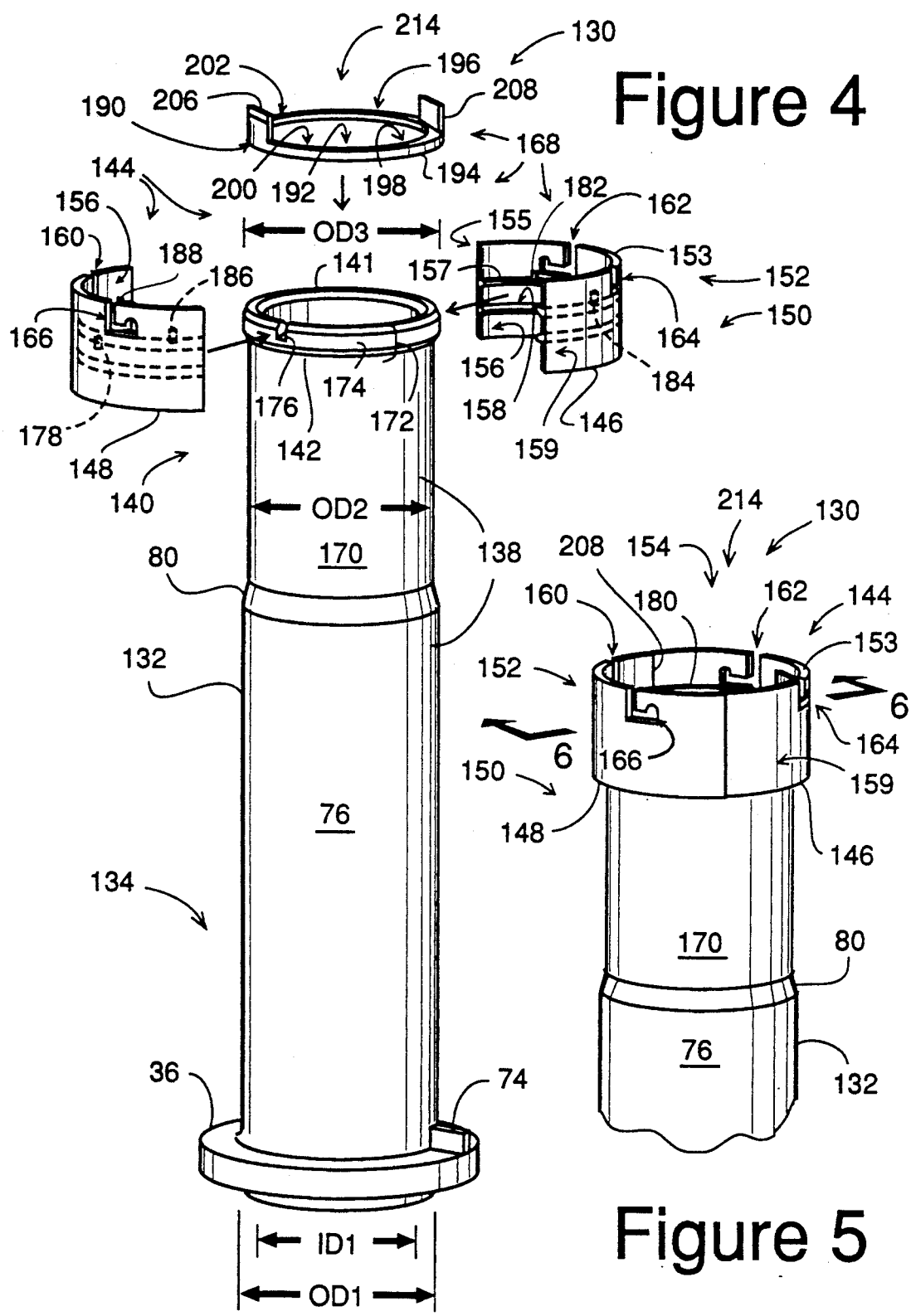

SUSPENSION SYSTEM FOR SEMICONDUCTOR REACTORS

BACKGROUND OF THE INVENTION

This invention relates generally to suspension systems for hanging objects and more particularly to suspension system for hanging a susceptor adapted to hold semiconductor wafers inside a reactor, such as an epitaxial reactor, during semiconductor processing.

FIG. 1 schematically illustrates a suspension system 20 for suspending a susceptor 26 inside a reaction chamber 23 of an epitaxial reactor 22. Reactors of this type are commercially available from Applied Materials, Inc. of Santa Clara, Calif., U.S.A. as models AMC-7810/11 and AMC-7820/21 Cylindrical Epitaxial Reactors. In reactor 22 the reaction chamber 23 is defined within an inverted quartz bell jar 24 made of a semiconductor-grade clear-fused quartz which is substantially transparent to infrared radiation, allowing for high heat transmission. The quartz is generally at least 90% pure silica and is substantially chemically inert to the environment within the reactor.

Susceptor 26 has a number of flat faces provided with hollow pouches which support semiconductor wafers 28. The number of flat faces is primarily determined by wafer size. A typical susceptor is a single-piece structure having its sides sloping outwardly from top to bottom to permit the flow of reactant gases across all the wafers and to prevent wafers from being dislodged from the pockets. Banks of suitable heat sources such as quartz-halogen lamps 30 are arrayed around the exterior of the bell jar and are powered by a lamp power supply for radiantly heating both susceptor 26 and wafers 28.

The lamp module design of an Applied Materials model AMC-7820/21 epitaxial reactor includes several lamp modules containing twenty 6000 watt quartz-halogen lamps generating infrared (IR) radiant light. Each lamp is associated with a gold-plated aluminum parabolic reflector to more efficiently direct the IR radiation towards the susceptor. Gases for epitaxial processing of the wafers are supplied through gas inlet ports, while radiation product waste gases are removed through exhaust ports.

FIGS. 2 and 3 show details of suspension system 20, which includes a quartz hanger 32 having a lower end 34 provided with a flange 36. Susceptor 26 of FIG. 1 is fitted at its bottom and top respectively with a removable lower cover 38 and upper cover 40, the latter defining through itself a cover aperture 42. A quartz tab 74 is joined to flange 36 and to the side of hanger 32; tab 74 engages a notch (not shown) in upper cover 40 of the susceptor to correctly align the collar and susceptor with respect to each other within the reactor. To suspend the susceptor, hanger 32 is mounted inside aperture 42 so flange 36 is in contact with the lower side of upper cover 40 to thereby support susceptor 26. An upper end 44 of hanger 32 is secured to an anchor 46 (FIG. 1) of a susceptor support mechanism formed in a removable reactor top plate assembly 48 using appropriate pressure seals.

Top plate 48 is coupled to drive assembly (not shown) which can lift and lower the suspension system and susceptor within the reaction chamber, and which can rotate the suspension system and susceptor during wafer processing to increase deposition uniformity. An instrument probe conduit 50 extends through top plate 48, anchor 46, hanger 32 and into the hollow interior 52 of susceptor 26 so that sensors such as a temperature probe 54 can monitor the operating parameters within the reactor.

Prior art suspension system 20, shown in exploded form in FIG. 2 and partially assembled in FIG. 3, further includes a collar 70 and a retainer 72; the latter two preferably manufactured from 316H or 174-PH stainless steel due to their high corrosion resistance. The hanger, collar and retainer each has a circular cross-section and are substantially coaxial about a common axis 73. Hanger 32 includes a first barrel 76 with an outside diameter OD1 and a second barrel 78 with an outside diameter OD2, separated by a relatively thin circular flat beveled face 80. The hanger has an inside diameter ID1 which is substantially uniform throughout the length of quartz hanger 32.

The OD1, OD2 and ID1 dimensions have been optimized relative to each other and with respect to the reactor parts with which hanger 32 interacts. Among the factors affecting this optimization are the mechanical strength of quartz, the diameter of aperture 42 in upper cover 40 of susceptor 26, the complex structure (not shown or discussed here) of top plate 48 including a gas flow path for admitting reactor gases along the surface of OD2 and into the reactor, the size and structure of anchor 46, and the size of instruments such as temperature probe 54 that must fit through probe conduit 50 for gaining access to hollow interior 52 of susceptor 26.

Toward upper end 44 of hanger 32, holes 82, 83, 84 and 85 are provided through the wall of the hanger. Three holes 82, 83 and 84 are spaced apart 90 degrees; hole 85 is 105 degrees away from hole 84 and 75 degrees away from hole 82 to provide proper alignment of suspension system 20 within the reactor. Collar 70 has four holes 86, 87, 88 and 89 positioned to be alignable respectively with hanger holes 82, 83, 84 and 85.

Retainer 72 has a lower edge 92 into which semicircular notches 94, 96, 98 and 100 are formed in the same spaced apart orientation respectively as collar holes 86, 87, 88 and 89. When hanger 32, collar 70 and retainer 72 are properly oriented for assembly, hanger holes 82, 83 and 84 and collar holes 86, 87 and 88 line up respectively with retainer notches 94, 96 and 98, while offset hanger hole 85 and offset collar hole 89 are aligned with offset notch 100. To complete this assembly, four rivets 102, 104, 106 and 108, also preferably manufactured from 316L or 174-PH stainless steel, are manually inserted through the holes and notches to join together collar 70 and retainer 72 for supporting hanger 32 directly from the four rivets. Four J-shaped slots 110, 112, 114 and 116 are cut 90 degrees apart into an upper collar rim 118 to mate with connectors (not shown) provided in anchor 46.

Even though the suspension system shown in FIGS. 2 and 3 has been used successfully for a number of years, certain disadvantages have come to be identified with this construction including the difficulty of its manufacture and assembly and its occasional premature failure due to fracturing of the hanger.

During manufacture, quartz hanger 32 is formed as a cylindrical tube that is then machined on a lathe to cut second barrel 78 and beveled face 80. Lathe machining provides precise dimensioning of the hanger exterior surface. Face 80 is cut at an inclined angle rather than a 90 degree angle to maintain the mechanical strength of the quartz hanger and for ease of manufacture when advancing the lathe cutting tool (not shown) inwardly from barrel 76 to cut into the hanger for forming barrel 78. A boring tool is used to cut holes 82, 83, 84 and 85 through hanger 32, and the holes are flame polished to remove rough edges. Unfortunately, drilling and flame polishing often produces holes having imprecise shapes and dimensions, causing alignment problems between the holes of hanger 32 with the corresponding openings machined into collar 70 and retainer 72. Such misalignments can cause hanger 32 to hang off-center from the rivets so the susceptor is not properly centered for optimal processing of the wafers and can create unbalanced stresses on the quartz hanger. Furthermore, drilling and heat treating can weaken the structure of quartz hanger 32.

Undesirable wear results from the above misalignment, and also from the load-supporting contact between the steel rivets and the quartz hanger. Because steel and quartz have different coefficients of thermal expansion, the thermal cycling inherent with the use of reactor causes the steel and quartz to expand and contract at different rates, resulting in the development of small cracks at the circumference of the holes and causing the quartz to wear away and flake off. These effects both weaken the quartz hanger and introduce particulate contamination into the reactor that can damage the wafers carried by the susceptor. In some cases the weakened holes in the quartz hanger can cause the end of the hanger to break off, allowing the susceptor and wafers to crash to the bottom of the bell jar.

The prior art suspension system is also difficult to assemble. Hanger 32 must be supported while collar 70 and retainer 72 are slipped over the end of the hanger and then appropriately aligned to permit insertion of the four rivets. Such multiple alignments are difficult to achieve while at the same time avoiding dropping any of the many pieces.

SUMMARY OF THE INVENTION

The apparatus of the present invention includes a hanger having a lower end coupled to a susceptor and an upper end coupled to an anchor. A hanger flange is formed on the exterior of the hanger's upper end. A tubular collar has an internal flange which engages the hanger flange. The two flanges have beveled mating surfaces which engage with each other to support the hanger and susceptor in a thermally and gravitationally stable manner. The collar preferably includes a pair of collar sections held together by a retainer.

The present invention offers the advantage of being easier to manufacture than the prior art hanger systems. The two major source of dimensional inaccuracy, the hole formation in and the heat processing of quartz hanger 32, have been eliminated. After the quartz hanger has been formed into a cylindrical hollow tube, the hanger is machined on a lathe to produce more precise dimensions than the dimensions achieved by prior art heat processing.

The suspension system of the present invention also offers the advantages of wearing more evenly and being easier to assemble by eliminating the prior art rivets, holes and notches connecting together the collar and hanger. Improved gimballing of the suspension system supporting the susceptor is provided by forming two mating, beveled, flanged surface which meet along a 360 degree interface, thereby giving the susceptor total freedom to find its own vertical axis as determined by the force of gravity.

These and other advantages of the present invention will become clear to those skilled in this technical art by studying the following Detailed Description and related Drawings.

BRIEF DESCRIPTION OF THE DRAWINGS

FIG. 4 is an exploded perspective view of a suspension system in accordance with the present invention;

FIG. 5 shows the top portion of FIG. 4 in a partially assembled configuration;

DETAILED DESCRIPTION OF THE PREFERRED EMBODIMENTS

Figure 1:
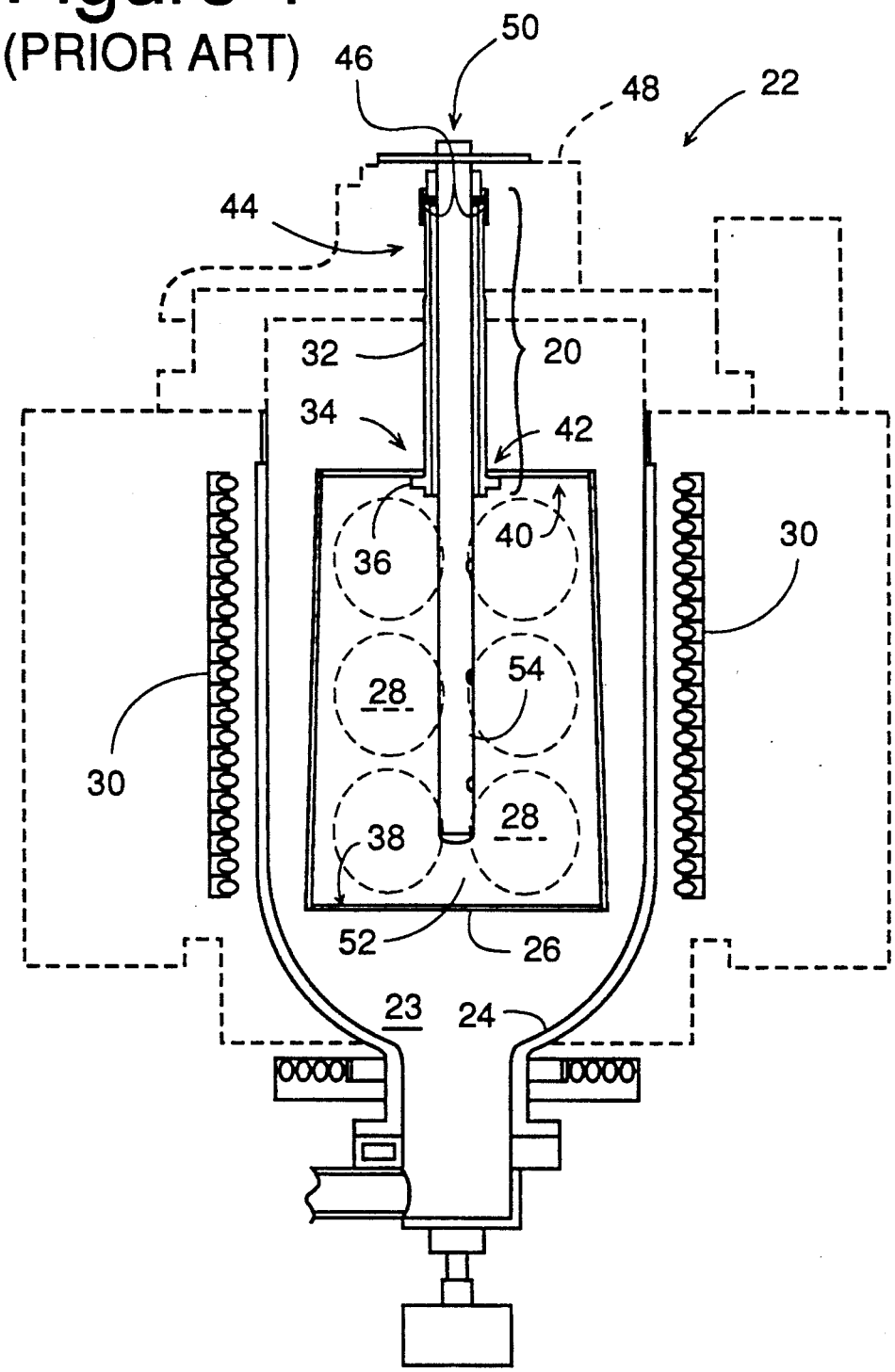
FIG. 1 shows schematically a prior art epitaxial reactor including a susceptor suspension system.
Figures 2, 3:
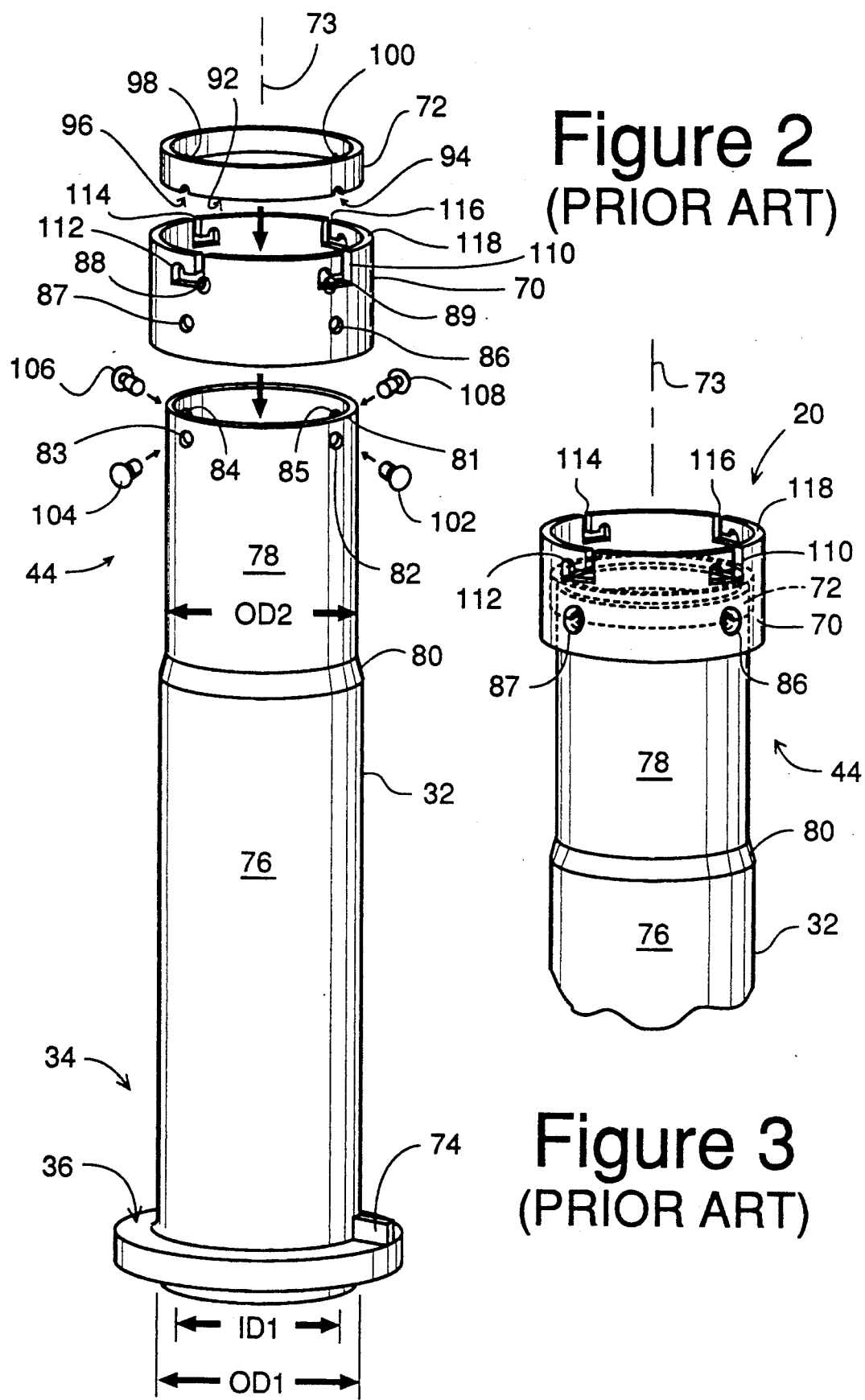
FIG. 2 is an exploded perspective view of a prior art suspension system.
FIG. 3 shows the top portion of FIG. 2 in its partially assembled configuration.

FIG. 4 is an exploded view of a suspension system 130 in accordance with the present invention for hanging a susceptor 26 from an overhead anchor 46 inside a reactor 22 as shown in FIG. 1. Suspension system 130 includes a hanger 132 having a lower end 134 which couples to susceptor 26, a hanger exterior surface 138, and an upper end 140 including an outwardly protruding hanger flange 142.

Also included is a collar 144 preferably including a first collar section 146 and a second collar section 148, having a lower end 150 and an upper end 152. Collar 144 is substantially tubular when assembled and has a collar interior surface 156. Lower end 150 includes a flange 158 extending inwardly from collar interior surface 156. Collar 144 is configured to engage anchor 46, for example using four J-shaped slots 160, 162, 164 and 166. A second flange 157 extends inwardly from collar interior surface 156 to limit the relative upward motion of hanger 132 with respect to collar 144. Further included is a retainer 168 for securing together collar sections 146 and 148.

Quartz is the material of choice for hanger 132 because of its dimensional stability over a wide temperature range and due to its high degree of transparence to IR radiation. Hanger 132 includes first barrel portion 76 with outside diameter OD1, beveled face portion 80 and a third barrel portion 170 with outside diameter OD2. Hanger flange 142 includes a flat exterior face 174 having an outside diameter OD3 which is equal to OD1. Therefore hanger 132 has a wall thickness at flange 142 that is greater than the wall thickness of prior art hanger 32 at its upper end 44, making hanger 132 stronger and less likely to fracture.

Some reactors require an alignment mechanism for registering the susceptor suspension system and reactor to permit robotic equipment (not shown) to properly move and place each with respect to one another; other reactors do not require this alignment. For example, the Applied Materials, Inc. Reactor Model AMC-7700 requires such registration capability. Therefore, machine-ground into flange 142 is an alignment notch 176 adapted to receive a stainless steel pin 178 attached to collar interior surface 156. Lower end 134 includes flange 36 for supporting the susceptor and a tab 74 is provided to align the hanger with the susceptor. In contrast, Reactor Model AMC-7800 does not require an alignment mechanism, so a hanger for this reactor would not need tab 74, notch 176 or pin 178.

Suspension system 130 can be used in a variety of reactors designed for semiconductor processing in which a susceptor holding wafers is hung in a heated and chemically reactive environment. System 130 was designed in particular for use in an epitaxial reactor typically operating at temperatures in the 1000–1200 degrees Centigrade range, with hanger 132 made of a pure silica glass (or quartz) that is typically at least 90% silica so the hanger is transparent to the infrared or ultraviolet light emitted by banks of lamps 30 for heating the reactor.

Figure 6:
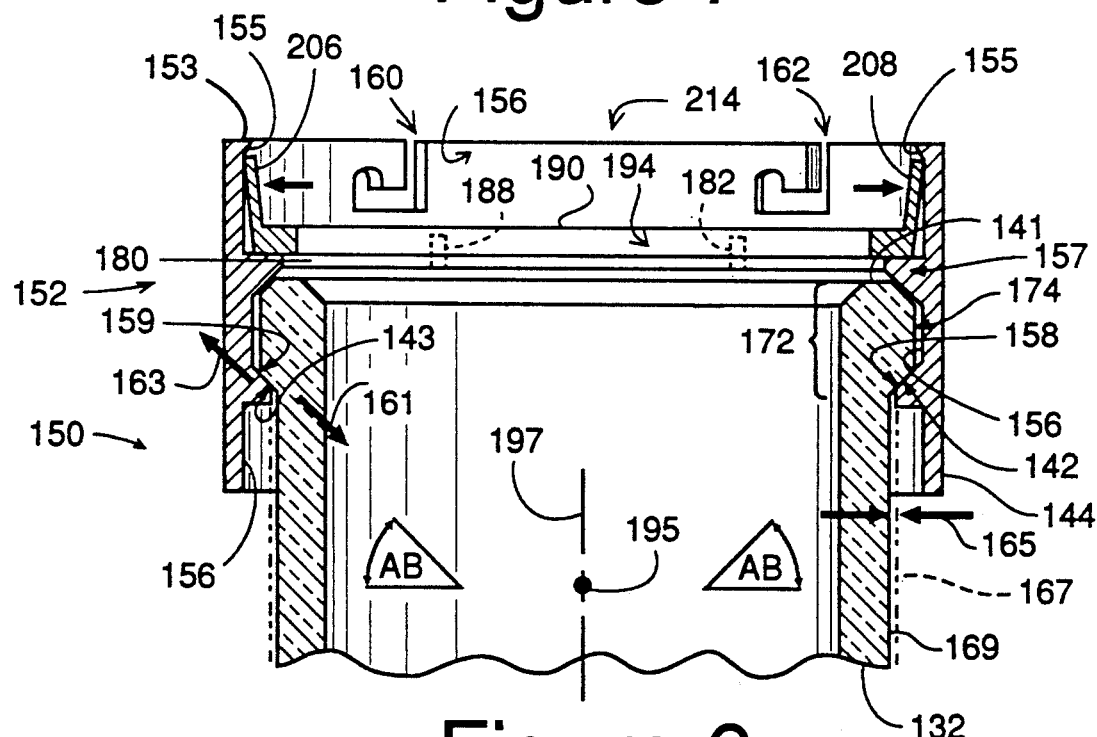
FIG. 6 is a cross-sectional view taken along line 6—6 of FIG. 5.

FIGS. 4, 5 and 6 show hanger flange 142 and collar flange 158 which include flat truncated conical contact surfaces 143 and 159 adapted to matingly engage with each other. The preferred embodiment includes flange surfaces 143 and 159 as continuous truncated conical surfaces in 360 degree contact with each other. Collar sections 146 and 148 are preferably made by forming a 360 degree continuous collar and then sawing it apart at two points 180 degrees away from each other with a saw having a kerf of about 0.010 inch.

As best seen in FIG. 4, collar 144 includes four collar pins 182, 184, 186 and 188 extending upward from second flange 157 attached to collar interior surface 156. Retainer 168 is substantially washer-shaped and includes four holes 196, 198, 200 and 202 for receiving the collar pins 182, 184, 186 and 188 for securing the collar sections together. Upwardly extending tabs 206 and 208 engage an upper portion of collar interior surface 156; these tabs preferably engage collar sections 146 and 148 near a middle point of their curvatures. When assembled as shown in FIG. 5, hanger 132, collar 144 and retainer 168 provide a passageway through themselves to permit insertion of temperature probe 54 to determine the temperature inside the reactor.

The preferred embodiment of suspension system 130 is self-centering because, when coupled to anchor 46 and supporting the weight of susceptor 26, conical contact surfaces 143 and 159 permit the susceptor to find its own true vertical hanging position by the force of gravity. Once reactor 22 has been properly leveled for receiving susceptor 26, the susceptor naturally hangs vertically from suspension system 130 within the reactor as desired for optimal wafer processing.

FIG. 6 shows that suspension system 132 is formed for providing a thermally self-adjusting system even though the hanger and collar are fabricated from materials having different coefficients of thermal expansion. Quartz hanger flange 142 and stainless steel collar flange 158 are dimensioned so when mounted together each is free to slide across each other when expanding and contracting thermally without contacting other objects and without loosing contact with each other. This arrangement will allow the quartz and steel at their interface to slide up and down across their mutually inclined interface without the hanger pushing into the interior sidewall of the collar and without the hanger support surface sliding down and out of contact with the collar support surface. The angles of contact surfaces 143 and 159 are preferably in the range of 30 to 60 degrees from the horizontal and more preferably about 45 degrees from the horizontal. Too steep of an angle may allow separation of the hanger and collar during heat cycling, while too small of an angle reduces the ability of the susceptor to self-center by the force of gravity.

Figure 7:
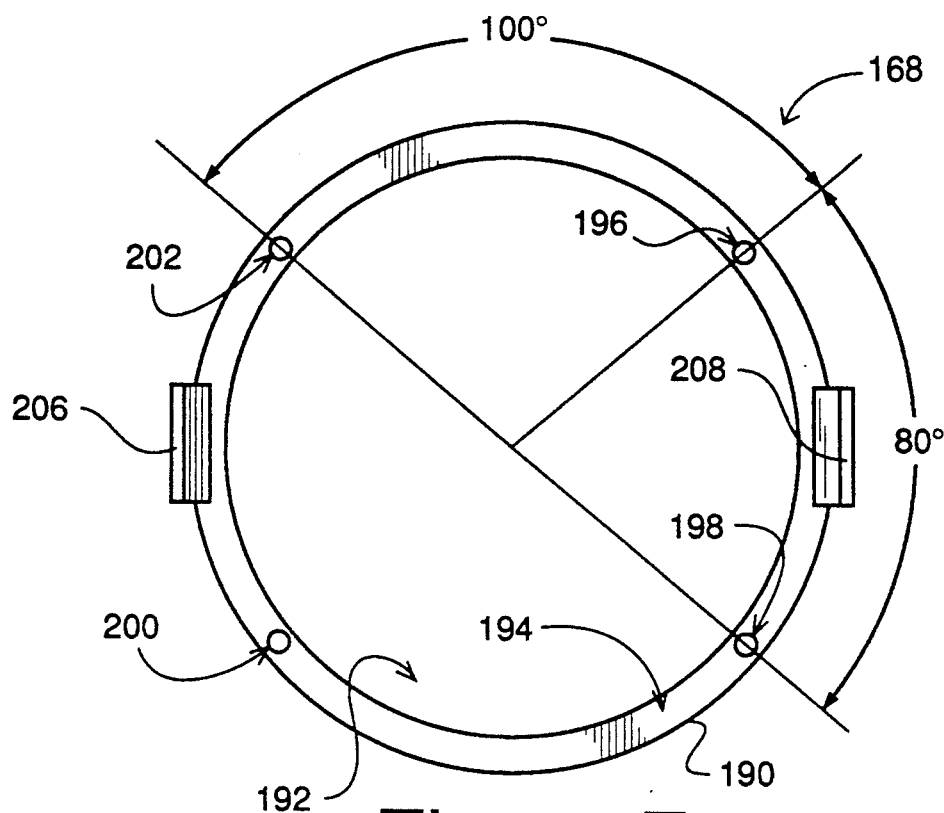
FIG. 7 is a top plan view of the retainer.

FIG. 7 shows a retainer 168 fabricated to enhance the load-carrying capability of the collar. Ring portion 194, when its holes 196–202 are penetrated by pins 182–188, pull the middles of collar section 146 and 146 together. Tabs 206 and 208 are bent slightly outward so they push against the upper portion of the inner surface of the collar sections when the retainer is seated in the collar. The base of retainer 168 presses against flange 157 of collar 144. The tabs thus push out at the upper region 152 of the collar, causing the bottom region 150 of the joined collar sections to be pushed more tightly together, thus providing a collar support surface capable of carrying a heavier load.

Quartz hanger 132 visible in FIG. 4 has been fabricated to have an overall length of 10 inches, an inside diameter ID1 of 1.70 inches and an outside diameter OD1 of 2.20 inches. Flange 36 is 0.25 inch thick; tab 74 is 0.30 inch high where it rises away from the flange. The flange and tab are formed as part of a separate quartz subassembly and then partially melted and fused onto hanger 132. Beveled face 80 is machined 3.29 inches below a top edge 141 of hanger 132 at an angle of 15 degrees from the vertical. Hanger flange 142 has a contact surface machined at a 45 degree angle from the horizontal, beginning at a distance of 0.31 inch below top edge 141. Notch 176 is machine ground to a depth of 0.30 inch.

Collar 144 of FIG. 4 was fabricated with an overall height of 1.25 inches. Collar flange 158 is cut to provide a support surface at 45 degrees with respect to the collar interior vertical wall, at a distance beginning 0.870 inch from a top edge 153 of the collar. Collar ring 180 was formed 0.48 inch down from collar top edge 153, with a thickness of 0.06 inch. The inside diameter is 2.145 inches and the outside diameter is 2.305 inches.

FIG. 7 shows the preferred positions in retainer 168 for locating tabs 206 and 208 and holes 196–202. Tabs 206 and 208 are 180 degrees apart; each tab is also positioned 90 degrees away from the cut made in collar 144 (see FIGS. 4 and 5) dividing the collar into two semicircular sections 146 and 148. Holes 196 and 200 are respectively 80 degrees away from holes 198 and 202; likewise holes 198 and 202 are respectively 100 degrees away from holes 200 and 196. Pins 182–188 are mounted in collar 144 in the same spacings as the holes in the retainer so the pins will be aligned to penetrate holes 196, 198, 200 and 202 when retainer 168 is secured into collar 144 for coupling together collar sections 146 and 148.

On retainer ring 168 shown in FIG. 7, tabs 206 and 208 were each formed as a 30 degree arc length measuring 0.555 inch, and having a height of 0.467 inch; ring 190 thickness is 0.09 inch. The interior of the collar when tabs 206 and 208 engage the collar walls were ground down beginning slightly below the top edge of the collar, thus forming an overhang lip 155 (see FIG. 6) on the interior collar wall 156 at the collar top edge 141. As noted before, tabs 204 and 206 are formed to be slightly sprung to push outward. Therefore when ring 190 is inserted into the top of collar 144 and seated on the collar pins, tabs 206 and 208 snap against the interior collar wall beneath the collar lip 155, the ring thus restrained from vertical as well as horizontal movement.

While a particular example of the claimed invention has been specifically shown in the drawings and described above in terms of a single preferred embodiment, it is contemplated that various alterations and permutations of the invention defined by the claims will become apparent to those skilled in this art, which alterations will thus produce different embodiment. It is therefore intended that the appended claims include all such alterations, permutations and different embodiments as fall within the true spirit and scope of the claimed invention.

What is claimed is:

1. A suspension system for hanging a susceptor within a reactor chamber of a semiconductor processing machine comprising:

an elongated hanger having a lower end adapted to be coupled to the top of a susceptor and an upper end provided with a hanger flange; and a support collar configured to receive said upper end of said hanger and provided with an internal collar flange adapted to engage with said hanger flange, said support collar being adapted to attach to a support mechanism of said semiconductor processing machine.

2. A suspension system as recited in claim 1 wherein said collar is formed in a plurality of sections, and further comprising retainer means securing said plurality of sections together.

3. A suspension system as recited in claim 1 wherein said hanger flange and said other collar flanges are provided with complementary truncated conical surfaces proximate their points of engagement.

4. A suspension system as recited in claim 3 wherein said truncated conical surfaces are in substantially constant 360 degree contact.

5. A suspension system as recited in claim 1 where said hanger is provided with a central passageway extending between said upper and lower ends.

6. A semiconductor processing machine comprising:
a reaction chamber;
a susceptor which is operationally disposed within said reaction chamber, said susceptor being adapted to support at least one semiconductor wafer;
a susceptor support mechanism located over the reaction chamber; and
a susceptor suspension system coupling said susceptor support mechanism to said susceptor, said susceptor suspension system comprising:

(a) an elongated hanger coupled at a lower end to said susceptor, said hanger having an upper end provided with an external flange; and (b) a collar coupled to said susceptor support mechanism, said collar having an internal flange which engages said external flange of said hanger.

7. A semiconductor processing machine as recited in claim 6 wherein said hanger is made substantially from quartz and wherein said collar is made substantially from metal.

8. A semiconductor processing machine as recited in claim 6 wherein said upper end of said hanger and said collar are substantially cylindrical and wherein said collar at least partially encircles said upper end of said hanger.

9. A semiconductor processing machine as recited in claim 8 wherein said external flange has a substantially truncated, conical hanger contact surface and wherein said internal flange has a substantially truncated, conical collar contact surface such that said hanger contact surface and said collar contact surface are in substantially continuous contact.

10. A semiconductor processing machine as recited in claim 9 wherein the angle of said hanger surface and said collar contact surface from the horizontal is between about 30 degrees and 60 degrees.

11. A semiconductor processing machine as recited in claim 10 wherein said angle is about 45 degrees.

12. A semiconductor processing machine as recited in claim 8 wherein said collar comprises a plurality of collar sections held together by a retainer means.

13. A semiconductor processing machine as recited in claim 12 wherein said collar includes a plurality of pins along an inner surface thereof and wherein said retainer means comprises a washer-shaped portion provided with apertures which operationally engages said pins to hold said plurality of collar sections together.

14. A semiconductor processing machine as recited in claim 13 wherein said pins are provided near an upper end of said collar contact surface is provided near a lower end of said collar and wherein said retainer means further comprises tabs extending from said washer-shaped portion and engaging an inner surface of said collar to urge said collar contact surface and said hanger contact surface together.

15. A semiconductor processing machine as recited in claim 14 wherein said collar further includes a second internal flange operationally located above said external flange of said hanger to limit the relative upward motion of said hanger with respect to said collar.

* * * * *